US012796287B2

(12) United States Patent
Na et al.

(10) Patent No.: US 12,796,287 B2
(45) Date of Patent: Nov. 10, 2026

(54) DISPLAY DEVICE

(71) Applicant: LG DISPLAY CO., LTD., Seoul (KR)

(72) Inventors: YunJin Na, Gyeonggi-do (KR); Jung-Min Lee, Gyeonggi-do (KR)

(73) Assignee: LG Display Co., Ltd. (KR)

(*) Notice: Subject to any disclaimer, the term of this patent is extended or adjusted under 35 U.S.C. 154(b) by 636 days.

(21) Appl. No.: 17/958,475

(22) Filed: Oct. 3, 2022

(65) Prior Publication Data

US 2023/0165070 A1 May 25, 2023

(30) Foreign Application Priority Data

Nov. 24, 2021 (KR) ........................ 10-2021-0163278

(51) Int. Cl.
*H10K 59/80* (2023.01)
*H10K 59/124* (2023.01)

(52) U.S. Cl.
CPC ......... *H10K 59/873* (2023.02); *H10K 59/124* (2023.02)

(58) Field of Classification Search
CPC ... H10K 50/844; H10K 59/124; H10K 59/873
See application file for complete search history.

(56) References Cited

U.S. PATENT DOCUMENTS

| | | | | |
|---|---|---|---|---|
| 10,879,491 | B1 * | 12/2020 | Yoo | H10K 77/10 |
| 11,348,985 | B2 | 5/2022 | Seon et al. | |
| 2018/0138450 | A1 | 5/2018 | Park et al. | |
| 2018/0151838 | A1 | 5/2018 | Park et al. | |
| 2020/0303677 | A1 | 9/2020 | Lee et al. | |
| 2020/0313102 | A1 * | 10/2020 | Kim | H10K 59/8723 |
| 2021/0193783 | A1 | 6/2021 | Kim et al. | |
| 2021/0288118 | A1 * | 9/2021 | Lee | H10K 59/131 |
| 2022/0158129 | A1 * | 5/2022 | Kim | H10K 50/844 |
| 2022/0190290 | A1 * | 6/2022 | Ochi | H05B 33/04 |
| 2022/0199946 | A1 * | 6/2022 | Lee | H10D 86/60 |
| 2023/0157096 | A1 * | 5/2023 | Zhou | H10K 59/873 257/72 |
| 2023/0422588 | A1 * | 12/2023 | Deng | H10K 59/8721 |
| 2024/0107850 | A1 * | 3/2024 | Xu | G06F 3/0445 |

FOREIGN PATENT DOCUMENTS

| | | | |
|---|---|---|---|
| CN | 110634928 | A | 12/2019 |
| CN | 111725257 | A | 9/2020 |
| CN | 112397553 | A | 2/2021 |
| KR | 10-2018-0054385 | A | 5/2018 |
| KR | 10-2018-0060851 | A | 6/2018 |
| KR | 10-2020-0073550 | A | 6/2020 |
| KR | 20200145902 | A | 12/2020 |
| KR | 10-2021-0020203 | A | 2/2021 |
| KR | 10-2021-0074549 | A | 6/2021 |
| KR | 10-2021-0080811 | A | 7/2021 |

OTHER PUBLICATIONS

Office Action in Korean Appln. No. 10-2021-0163278, mailed on May 30, 2025, 9 pages (with English translation).

* cited by examiner

*Primary Examiner* — Shaun M Campbell
(74) *Attorney, Agent, or Firm* — Fish & Richardson P.C.

(57) ABSTRACT

A display device includes a display panel having a through-hole and a rough pattern around the through-hole, an optical electronic device positioned to at least partially overlap with the through-hole, and a metal pattern positioned in a valley of the rough pattern. Thus, it is possible to provide a robust display device against moisture that may be introduced through the through-hole.

19 Claims, 13 Drawing Sheets

RP
TH
ORP
IRP
AA
OA
I
I'
DMI
Trimming Line
SA
TH
SA

DISPLAY DEVICE

CROSS-REFERENCE TO RELATED APPLICATION

This application claims priority from Korean Patent Application No. 10-2021-0163278, filed on Nov. 24, 2021, which is hereby incorporated by reference in its entirety.

BACKGROUND

Field of the Disclosure

The present disclosure relates to display devices.

Description of the Background

With the development of technology, the display device may provide a capture function and various detection functions in addition to an image display function. To this end, the display device includes an optical electronic device (also referred to as a light receiving device or sensor), such as a camera and a detection sensor.

Since the optical electronic device receives light from the front of the display device, it should be installed where light reception is easy. Accordingly, the camera (or camera lens) and the detection sensor may be exposed on the front surface of the display device. Thus, the bezel of the display panel is widened or a notch is formed in the display area of the display panel, and a camera or a detection sensor is installed there.

When the bezel is broadened or a notch is formed in the front surface of the display panel, the display area for displaying images on the display panel is inevitably reduced.

SUMMARY

Accordingly, the present disclosure is to provide a display device in which an optical electronic device is disposed in a through-hole surrounded by the display area.

The present disclosure is also to provide a display device capable of preventing moisture from penetrating into the display area through the through-hole in the display panel.

The present disclosure is also to provide a display device comprising a display panel having a through-hole and a rough pattern around the through-hole, an optical electronic device positioned to at least partially overlap with the through-hole, and a metal pattern positioned in a valley of the rough pattern.

To achieve these and other advantages and in accordance with the present disclosure, as embodied and broadly described, a display device includes a display panel having a through-hole and a rough pattern around the through-hole; an optical electronic device positioned to at least partially overlap with the through-hole; and a metal pattern positioned in a valley of the rough pattern.

In an aspect of the present disclosure, a display device includes a display panel including a through-hole, an optical area having a rough pattern including a mountain and a valley around the through-hole, and a display area where a subpixel is positioned outside the optical area; and an optical electronic device positioned to at least partially overlap with the through-hole, wherein the rough pattern includes an outer side rough pattern positioned adjacent to the through-hole; and an inner side rough pattern positioned adjacent to the display area, outside the outer side rough pattern, wherein the valley in the inner side rough pattern is deeper than the valley in the outer side rough pattern.

In a further aspect of the present disclosure, a display device includes a substrate; a through-hole of the substrate; a rough pattern around the through-hole; and a metal pattern positioned in a valley of the rough pattern.

Various aspects of the present disclosure provides a display device in which an optical electronic device is disposed in a through-hole surrounded by the display area.

Various aspects of the present disclosure provides a display device capable of preventing moisture from penetrating into the display area through the through-hole in the display panel.

It is to be understood that both the foregoing general description and the following detailed description are exemplary and explanatory and are intended to provide further explanation of the disclosure as claimed.

BRIEF DESCRIPTION OF THE DRAWINGS

The above and other features and advantages of the present disclosure will be more clearly understood from the following detailed description, taken in conjunction with the accompanying drawings, in which.

DETAILED DESCRIPTION

Figure 1A:
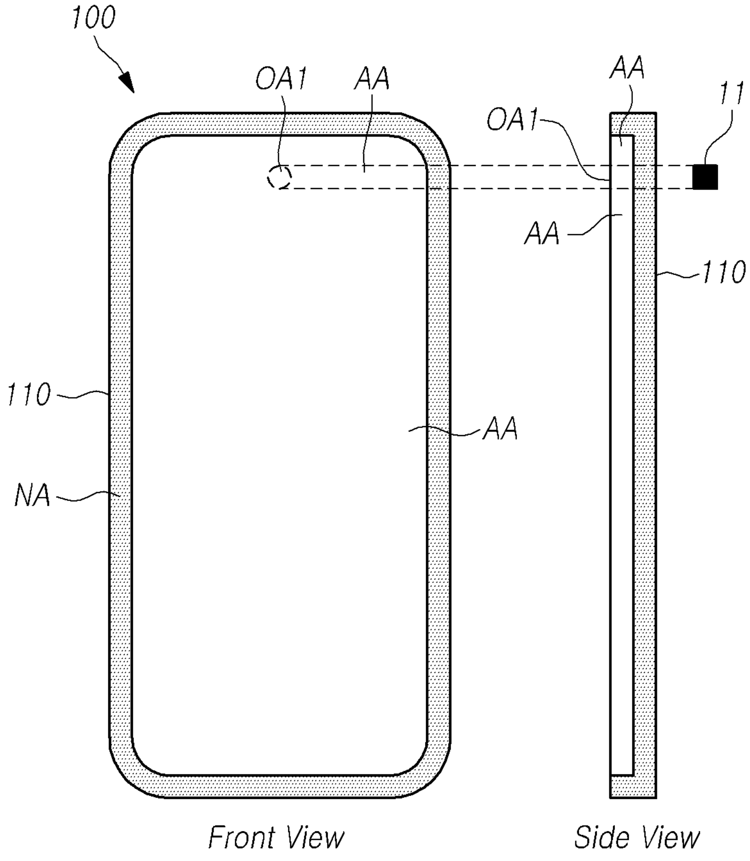
FIGS. 1A, 1B, and 1C are plan views illustrating a display device according to aspects of the present disclosure.

In the following description of examples or aspects of the present disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps with" etc. a second element, it should be interpreted that, not only can the first element "be directly connected or coupled to" or "directly contact or overlap with" the second element, but a third element can also be "interposed" between the first and second elements, or the first and second elements can "be connected or coupled to", "contact or overlap with", etc. each other via a fourth element. Here, the second element may be included in at least one of two or more elements that "are connected or coupled to", "contact or overlap with", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various aspects of the present disclosure are described in detail with reference to the accompanying drawings.

Figure 1B:
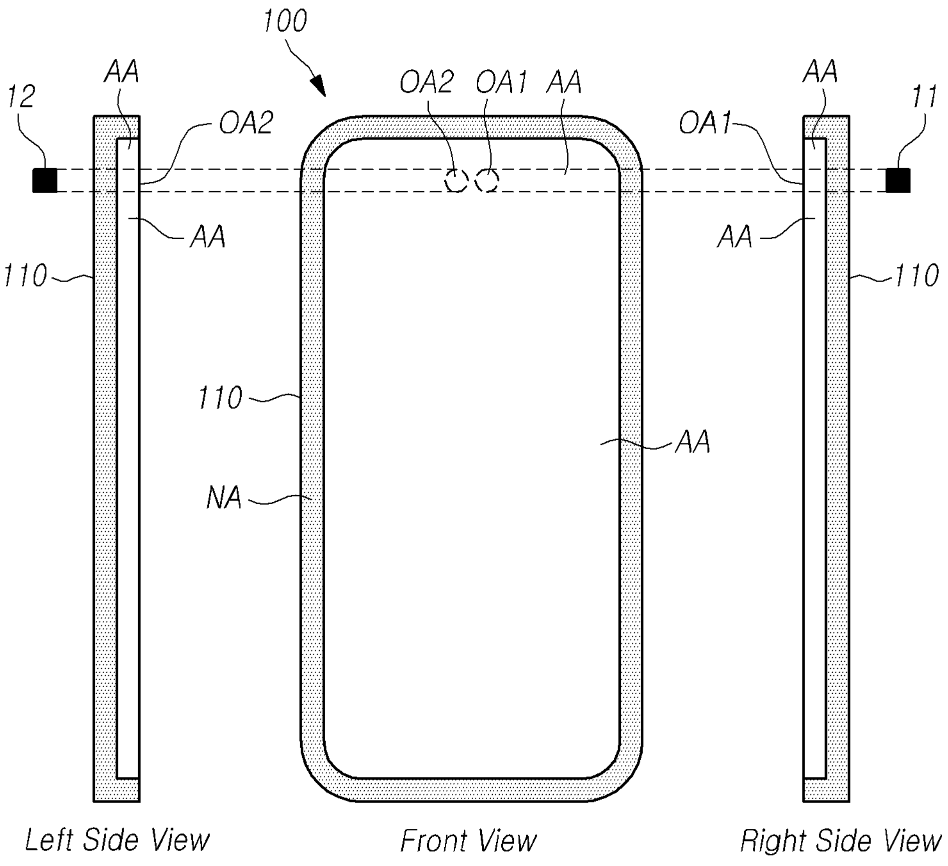
Figure 1C:
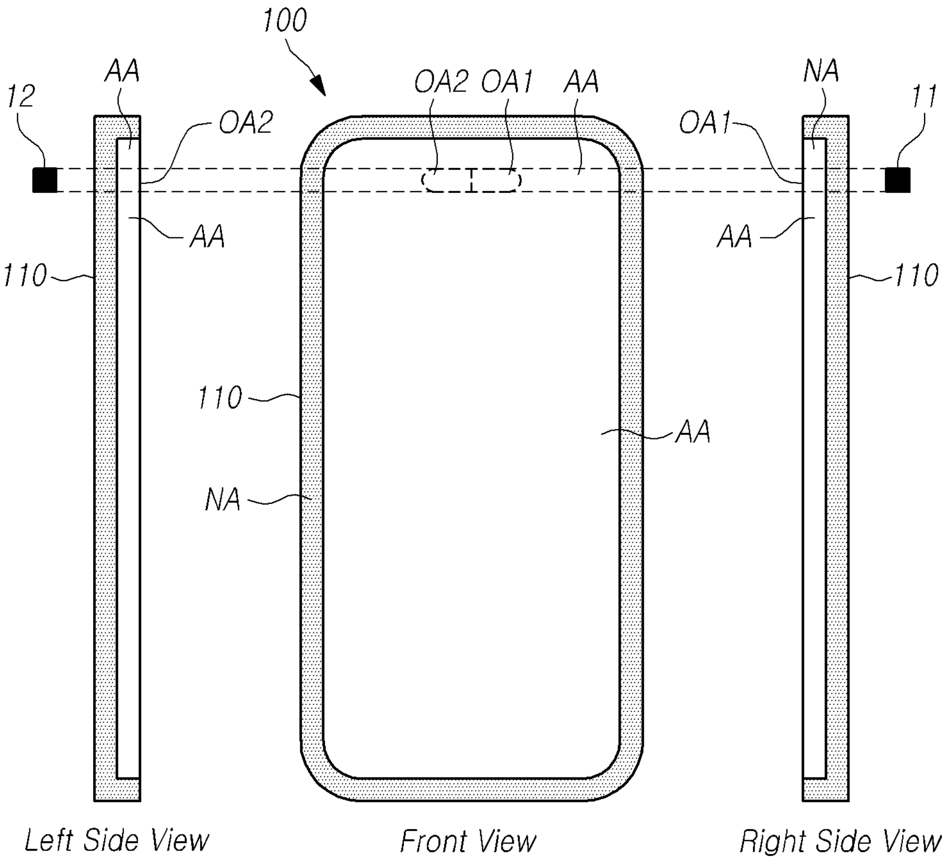

FIGS. 1A, 1B, and 1C are plan views illustrating a display device according to aspects of the present disclosure.

Referring to FIGS. 1A, 1B, and 1C, a display device 100 according to aspects of the present disclosure may include a display panel 110 for displaying images and one or more optical electronic devices 11 and 12.

The display panel 110 may include a display area AA in which images are displayed and a non-display area NA in which no image is displayed.

A plurality of subpixels may be disposed in the display area AA, and various signal lines for driving the plurality of subpixels may be disposed in the display area AA.

The non-display area NA may be an area outside the display area AA. In the non-display area NA, various signal lines may be disposed, and various driving circuits may be connected thereto. The non-display area NA may be bent to be invisible from the front or may be covered by a case (not shown). The non-display area NA is also referred to as a bezel or a bezel area.

Referring to FIGS. 1A, 1B, and 1C, in the display device 100 according to aspects of the present disclosure, one or more optical electronic devices 11 and 12 are electronic components positioned under the display panel 110 (side opposite to the viewing surface).

Light enters the front surface (viewing surface) of the display panel 110 and passes through the display panel 110 to one or more optical electronic devices 11 and 12 positioned under the display panel 110 (opposite to the viewing surface).

The one or more optical electronic devices 11 and 12 may be devices that receive the light transmitted through the display panel 110 and perform a predetermined function according to the received light. For example, the one or more optical electronic devices 11 and 12 may include one or more of a capture device, such as a camera (image sensor), and a detection sensor, such as a proximity sensor and an illuminance sensor.

Referring to FIGS. 1A, 1B, and 1C, the display panel 110 according to aspects of the present disclosure may include one or more optical areas OA1 and OA2.

Referring to FIGS. 1A, 1B, and 1C, the one or more optical areas OA1 and OA2 may be areas overlapping with the one or more optical electronic devices 11 and 12.

According to the example of FIG. 1A, the display area AA may be positioned outside the first optical area OA1. The display area AA may be positioned to surround the first optical area OA1. At least a portion of the first optical area OA1 may overlap with the first optical electronic device 110.

According to the example of FIG. 1B, the display area AA may be positioned outside the first optical area OA1 and the second optical area OA2. The display area AA may be positioned to surround the first optical area OA1 and the second optical area OA2. In the example of FIG. 1B, the display area AA exists between the first optical area OA1 and the second optical area OA2. At least a portion of the first optical area OA1 may overlap with the first optical electronic device 11, and at least a portion of the second optical area OA2 may overlap with the second optical electronic device 12.

According to the example of FIG. 1C, the display area AA may be positioned outside the first optical area OA1 and the second optical area OA2. The display area AA may be positioned to surround the first optical area OA1 and the second optical area OA2. In the example of FIG. 1C, the display area AA does not exist between the first optical area OA1 and the second optical area OA2. In other words, the first optical area OA1 and the second optical area OA2 touch each other. At least a portion of the first optical area OA1 may overlap with the first optical electronic device 11, and at least a portion of the second optical area OA2 may overlap with the second optical electronic device 12.

The one or more optical areas OA1 and OA2 should have a light transmission structure. A light transmission structure for transmitting light to the one or more optical electronic devices 11 and 12 should be formed in one or more optical areas OA1 and OA2.

The one or more optical electronic devices 11 and 12 are devices that require light reception, but are positioned behind (below, opposite to the viewing surface) the display panel 110 to receive the light transmitted through the display panel 110.

The one or more optical electronic devices 11 and 12 may be exposed on the front surface (viewing surface) of the display panel 110.

For example, the first optical electronic device 11 may be a camera, and the second optical electronic device 12 may be a detection sensor, such as a proximity sensor or an illuminance sensor. For example, the detection sensor may be an infrared sensor that detects infrared rays.

Conversely, the first optical electronic device 11 may be a detection sensor, and the second optical electronic device 12 may be a camera.

Hereinafter, for convenience of description, it is assumed that the first optical electronic device 110 is a camera and the second electronic device 12 is a detection sensor. The camera may be a camera lens or an image sensor.

If the first optical electronic device 110 is a camera, the camera may be a front camera that is positioned behind (below) the display panel 110 but captures forward of the display panel 110. Accordingly, the user may capture through the camera while looking at the viewing surface of the display panel 110.

The first optical area OA1 may have various shapes, such as a circle, an ellipse, a quadrangle, a hexagon, or an octagon. The second optical area OA2 may have various shapes, such as a circle, an ellipse, a square, a hexagon, or an octagon. The first optical area OA1 and the second optical area OA2 may have the same shape or different shapes.

Referring to FIG. 1C, when the first optical area OA1 and the second optical area OA2 touch, the entire optical area including the first optical area OA1 and the second optical area OA2 may have various shapes, such as a circle, an ellipse, a square, a hexagon, or an octagon.

Hereinafter, for convenience of description, each of the first optical area OA1 and the second optical area OA2 is exemplified as having a circular shape.

In the display device 100 according to aspects of the present disclosure, when the optical areas OA1 and OA2 are surrounded by the display area AA, the display device 100 according to aspects of the present disclosure may be referred to as a display to which a hole in active area (HiAA) technology has been applied.

Accordingly, in the display device 100 according to aspects of the present disclosure, a notch for camera exposure may not be formed in the display panel 110. The display device 100 according to the aspects of the present disclosure may have a camera hole for camera exposure.

Since there is no need to form a notch in the display panel 110, the size of the bezel area may be reduced, and design restrictions may be reduced, thereby increasing the degree of freedom in design.

Figure 2:
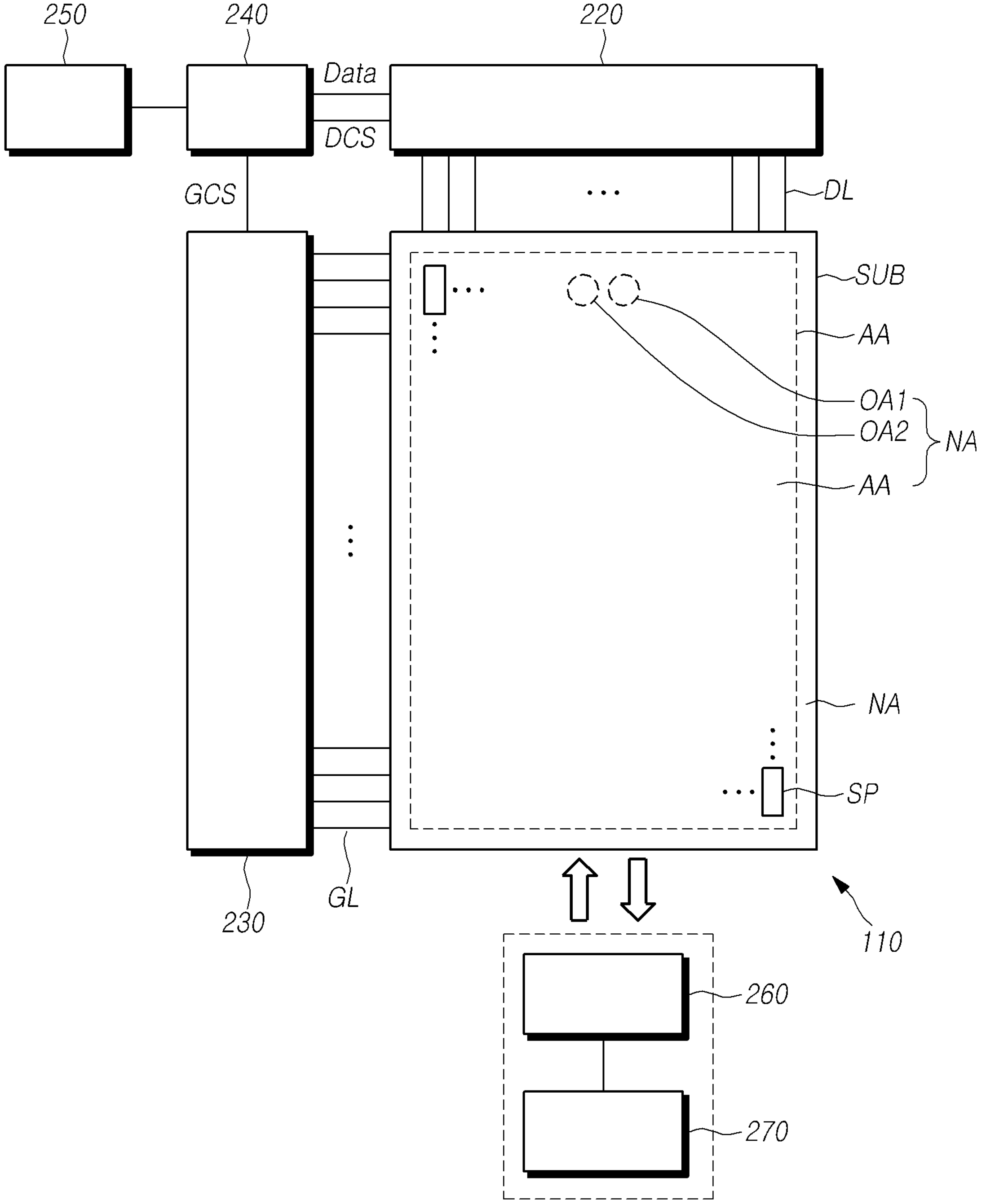
FIG. 2 is a view illustrating a system configuration of a display device according to aspects of the present disclosure.

FIG. 2 is a view illustrating a system configuration of a display device 100 according to aspects of the present disclosure.

Referring to FIG. 2, the display device 100 may include a display panel 110 and a display driving circuit as components for displaying an image.

The display driving circuits are circuits for driving the display panel 110 and may include a data driving circuit 220, a gate driving circuit 230, and a display controller 240.

The display panel 110 may include a display area AA in which images are displayed and a non-display area NA in which no image is displayed. The non-display area NA may be an outer area of the display area AA and be referred to as a bezel area. The whole or part of the non-display area AA may be an area visible from the front surface of the display device 100 or an area that is bent and not visible from the front surface of the display device 100.

The display panel 110 may include a substrate SUB and a plurality of subpixels SP disposed on the substrate SUB. The display panel 110 may further include various types of signal lines to drive the plurality of subpixels SP.

The display device 100 according to aspects of the present disclosure may be a liquid crystal display device or a self-emission display device in which the display panel 110 emits light by itself. When the display device 100 according to the aspects of the present disclosure is a self-emission display device, each of the plurality of subpixels SP may include a light emitting element.

For example, the display device 100 according to aspects of the present disclosure may be an organic light emitting diode display in which the light emitting element is implemented as an organic light emitting diode (OLED). As another example, the display device 100 according to aspects of the present disclosure may be an inorganic light emitting display device in which the light emitting element is implemented as an inorganic material-based light emitting diode. As another example, the display device 100 according to aspects of the present disclosure may be a quantum dot display device in which the light emitting element is implemented as a quantum dot which is self-emission semiconductor crystal.

The structure of each of the plurality of subpixels SP may vary according to the type of the display device 100. For example, when the display device 100 is a self-emission display device in which the subpixels SP emit light by themselves, each subpixel SP may include a light emitting element that emits light by itself, one or more transistors, and one or more capacitors.

For example, various types of signal lines may include a plurality of data lines DL transferring data signals (also referred to as data voltages or image signals) and a plurality of gate lines GL transferring gate signals (also referred to as scan signals).

The plurality of data lines DL and the plurality of gate lines GL may cross each other. Each of the plurality of data lines DL may be disposed to extend in a first direction. Each of the plurality of gate lines GL may be disposed to extend in a second direction.

Here, the first direction may be a column direction and the second direction may be a row direction. Alternatively, the first direction may be the row direction, and the second direction may be the column direction.

The data driving circuit 220 is a circuit for driving the plurality of data lines DL, and may output data signals to the plurality of data lines DL. The gate driving circuit 230 is a circuit for driving the plurality of gate lines GL, and may output gate signals to the plurality of gate lines GL.

The display controller 240 is a device for controlling the data driving circuit 220 and the gate driving circuit 230 and may control driving timings for the plurality of data lines DL and driving timings for the plurality of gate lines GL.

The display controller 240 may supply a data driving control signal DCS to the data driving circuit 220 to control the data driving circuit 220 and may supply a gate driving control signal GCS to the gate driving circuit 230 to control the gate driving circuit 230.

The display controller 240 may receive input image data from the host system 250 and supply image data Data to the data driving circuit 220 based on the input image data.

The data driving circuit 220 may supply data signals to the plurality of data lines DL according to the driving timing control of the display controller 240.

The data driving circuit 220 may receive digital image data Data from the display controller 240 and may convert the received image data Data into analog data signals and output the analog data signals to the plurality of data lines DL.

The gate driving circuit 230 may supply gate signals to the plurality of gate lines GL according to the timing control of the display controller 240. The gate driving circuit 230 may receive a first gate voltage corresponding to a turn-on level voltage and a second gate voltage corresponding to a turn-off level voltage, along with various gate driving control signals GCS, generate gate signals, and supply the generated gate signals to the plurality of gate lines GL.

For example, the data driving circuit 220 may be connected with the display panel 110 by a tape automated bonding (TAB) method or connected to a bonding pad of the display panel 110 by a chip on glass (COG) or chip on panel (COP) method or may be implemented by a chip on film (COF) method and connected with the display panel 110.

The gate driving circuit 230 may be connected with the display panel 110 by a tape automated bonding (TAB) method or connected to a bonding pad of the self-emission display panel 110 by a COG or chip on panel (COP) method or may be connected with the display panel 110 according to a COF method. The gate driving circuit 230 may be formed in a gate in panel (GIP) type, in the non-display area NA of the display panel 110. The gate driving circuit 230 may be disposed on the substrate SUB or may be connected to the substrate SUB. In other words, the gate driving circuit 230 that is of a GIP type may be disposed in the non-display area NA of the substrate SUB. The gate driving circuit 230 that is of a chip-on-glass (COG) type or chip-on-film (COF) type may be connected to the substrate SUB.

Meanwhile, at least one of the data driving circuit 220 and the gate driving circuit 230 may be disposed in the display area AA of the display panel 110. For example, at least one of the data driving circuit 220 and the gate driving circuit 230 may be disposed not to overlap with the subpixels SP or to overlap with all or some of the subpixels SP.

The data driving circuit 220 may be connected with one side (e.g., an upper or lower side) of the display panel 110. Depending on the driving scheme or the panel design scheme, the data driving circuit 220 may be connected with both sides (e.g., upper and lower sides) of the self-emission display panel 110, or two or more of the four sides of the self-emission display panel 110.

The gate driving circuit 230 may be connected to one side (e.g., a left or right side) of the display panel 110. Depending on the driving scheme or the panel design scheme, the gate driving circuit 230 may be connected with both sides (e.g., left and right sides) of the display panel 110, or two or more of the four sides of the display panel 110.

The display controller 240 may be implemented as a separate component from the data driving circuit 220, or the display controller 140 and the data driving circuit 220 may be integrated into an integrated circuit (IC).

The display controller 240 may be a timing controller used in typical display technology, a control device that may perform other control functions as well as the functions of the timing controller, or a control device other than the timing controller, or may be a circuit in the control device. The display controller 240 may be implemented as various circuits or electronic components, such as an integrated circuit (IC), a field programmable gate array (FPGA), an application specific integrated circuit (ASIC), or a processor.

The display controller 240 may be mounted on a printed circuit board or a flexible printed circuit and may be electrically connected with the data driving circuit 220 and the gate driving circuit 230 through the printed circuit board or the flexible printed circuit.

The display controller 240 may transmit/receive signals to/from the data driving circuit 220 according to one or more predetermined interfaces. The interface may include, e.g., a low voltage differential signaling (LVDS) interface, an EPI interface, and a serial peripheral interface (SPI).

To provide a touch sensing function as well as an image display function, the display device 100 according to aspects of the present disclosure may include a touch sensor and a touch sensing circuit that senses the touch sensor to detect whether a touch occurs by a touch object, such as a finger or pen, or the position of the touch.

The touch sensing circuit may include a touch driving circuit 260 that drives and senses the touch sensor and generates and outputs touch sensing data and a touch controller 270 that may detect an occurrence of a touch or the position of the touch using touch sensing data.

The touch sensor may include a plurality of touch electrodes. The touch sensor may further include a plurality of touch lines for electrically connecting the plurality of touch electrodes and the touch driving circuit 260.

The touch sensor in the form of a touch panel may exist outside the display panel 110, or the touch sensor may exist inside the display panel 110. When the touch panel, in the form of a touch panel, exists outside the display panel 110, the touch panel is referred to as an external type. When the touch sensor is of the external type, the touch panel and the display panel 110 may be separately manufactured or may be combined during an assembly process. The external-type touch panel may include a touch panel substrate and a plurality of touch electrodes on the touch panel substrate.

When the touch sensor is present inside the display panel 110, the touch sensor may be formed on the substrate SUB, together with signal lines and electrodes related to display driving, during the manufacturing process of the display panel 110.

The touch driving circuit 260 may supply a touch driving signal to at least one of the plurality of touch electrodes and may sense at least one of the plurality of touch electrodes to generate touch sensing data.

The touch sensing circuit may perform touch sensing in a self-capacitance sensing scheme or a mutual-capacitance sensing scheme.

When the touch sensing circuit performs touch sensing in the self-capacitance sensing scheme, the touch sensing circuit may perform touch sensing based on capacitance between each touch electrode and the touch object (e.g., finger or pen).

According to the self-capacitance sensing scheme, each of the plurality of touch electrodes may serve both as a driving touch electrode and as a sensing touch electrode. The touch driving circuit 260 may drive all or some of the plurality of touch electrodes and sense all or some of the plurality of touch electrodes.

When the touch sensing circuit performs touch sensing in the mutual-capacitance sensing scheme, the touch sensing circuit may perform touch sensing based on capacitance between the touch electrodes.

According to the mutual-capacitance sensing scheme, the plurality of touch electrodes are divided into driving touch electrodes and sensing touch electrodes. The touch driving circuit 260 may drive the driving touch electrodes and sense the sensing touch electrodes.

The touch driving circuit 260 and the touch controller 270 included in the touch sensing circuit may be implemented as separate devices or as a single device. The touch driving circuit 260 and the data driving circuit 220 may be implemented as separate devices or as a single device.

The display device 100 may further include a power supply circuit for supplying various types of power to the display driver integrated circuit and/or the touch sensing circuit.

The display device 100 according to aspects of the present disclosure may be a mobile terminal, such as a smart phone or a tablet, or a monitor or television (TV) in various sizes but, without limited thereto, may be a display in various types and various sizes capable of displaying information or images.

Figure 3:
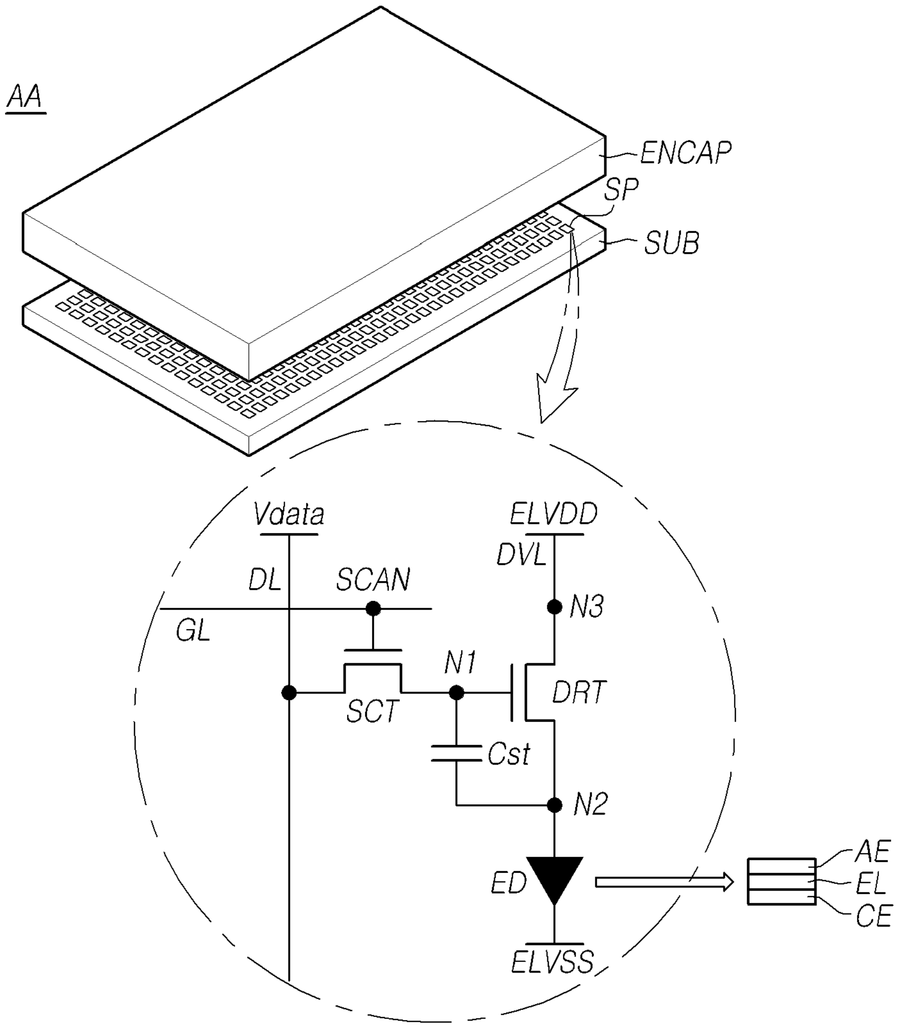
FIG. 3 is a view illustrating an equivalent circuit of a subpixel in a display panel according to aspects of the present disclosure.

FIG. 3 is an equivalent circuit of a subpixel SP in a display panel 110 according to aspects of the present disclosure.

Each subpixel SP in the display area AA of the display panel 110 may include a light emitting element ED, a driving transistor DRT for driving the light emitting element ED, a scan transistor SCT for transferring a data voltage Vdata to a first node N1 of the driving transistor DRT, and a storage capacitor Cst for maintaining a constant voltage during one frame.

The driving transistor DRT may include the first node N1 to which the data voltage Vdata may be applied, a second node N2 electrically connected with the light emitting element ED, and a third node N3 to which a driving voltage ELVDD is applied from a driving voltage line DVL. The first node N1 in the driving transistor DRT may be a gate node, the second node N2 may be either a source node or a drain node, and the third node N3 may be the other of the source node and the drain node.

The light emitting element ED may include an anode electrode AE, a light emitting layer EL, and a cathode electrode CE. The anode electrode AE may be a pixel electrode disposed in each subpixel SP and be electrically connected to the second node N2 of the driving transistor DRT of each subpixel SP. The cathode electrode CE may be a common electrode commonly disposed in the plurality of subpixels SP, and a base voltage ELVSS may be applied thereto.

For example, the anode electrode AE may be a pixel electrode, and the cathode electrode CE may be a common electrode. Conversely, the anode electrode AE may be a common electrode, and the cathode electrode CE may be a pixel electrode. Hereinafter, for convenience of description, it is assumed that the anode electrode AE is a pixel electrode and the cathode electrode CE is a common electrode.

For example, the light emitting element ED may be an organic light emitting diode (OLED), an inorganic light emitting diode, or a quantum dot light emitting element. In this case, when the light emitting element ED is an organic light emitting diode, the light emitting layer EL of the light emitting element ED may include an organic light emitting layer including an organic material.

The scan transistor SCT may be on/off controlled by a scan signal SCAN, which is a gate signal, applied via the gate line GL and be electrically connected between the first node N1 of the driving transistor DRT and the data line DL.

The storage capacitor Cst may be electrically connected between the first node N1 and second node N2 of the driving transistor DRT.

Each subpixel SP may have a 2T (transistor) 1C (capacitor) structure including two transistors DRT and SCT and one capacitor Cst. In some cases, each subpixel SP may further include one or more transistors or may further include one or more capacitors.

The capacitor Cst may be an external capacitor intentionally designed to be outside the driving transistor DRT, but not a parasite capacitor (e.g., Cgs or Cgd) which is an internal capacitor that may be present between the first node N1 and the second node N2 of the driving transistor DRT.

Each of the driving transistor DRT and the scan transistor SCT may be an n-type transistor or a p-type transistor.

Since the circuit elements (particularly, the light emitting element ED) in each subpixel SP are vulnerable to external moisture or oxygen, an encapsulation layer ENCAP may be disposed on the display panel 110 to prevent penetration of external moisture or oxygen into the circuit elements (particularly, the light emitting element ED). The encapsulation layer ENCAP may be disposed to cover the light emitting elements ED.

Figure 4:
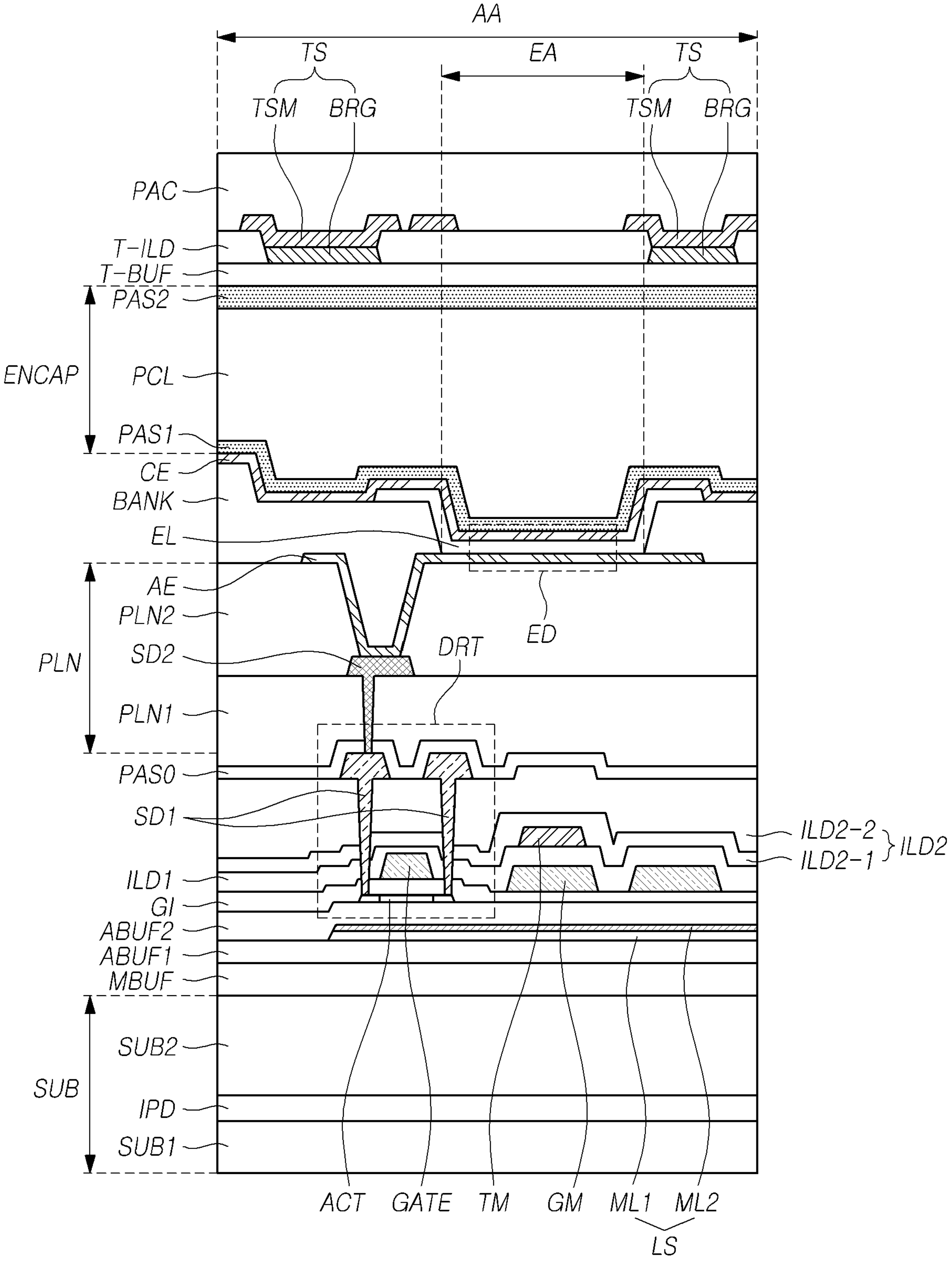
FIG. 4 is a cross-sectional view illustrating a display area of a display panel according to aspects of the present disclosure.

FIG. 4 is a cross-sectional view illustrating a display area AA of a display panel 110 according to aspects of the present disclosure.

Referring to FIG. 4, the substrate SUB may include a first substrate SUB1, an inter-layer insulation film IPD, and a second substrate SUB2. The inter-layer insulation film IPD may be positioned between the first substrate SUB1 and the second substrate SUB2. By configuring the substrate SUB with the first substrate SUB1, the inter-layer insulation film IPD and the second substrate SUB2, it is possible to prevent moisture penetration. For example, the first substrate SUB1 and the second substrate SUB2 may be polyimide (PI) substrates. The first substrate SUB1 may be referred to as a primary PI substrate, and the second substrate SUB2 may be referred to as a secondary PI substrate.

Referring to FIG. 4, on the substrate SUB, various patterns ACT, SD1, and GATE for forming a transistor, such as a driving transistor DRT, various insulation films MBUF, ABUF1, ABUF2, GI, ILD1, ILD2, and PAS0, and various metal patterns TM, GM, ML1, and ML2 may be disposed.

Referring to FIG. 4, a multi-buffer layer MBUF may be disposed on the second substrate SUB2. A first active buffer layer ABUF1 may be disposed on the multi-buffer layer MBUF.

A first metal layer ML1 and a second metal layer ML2 may be disposed on the first active buffer layer ABUF1. The first metal layer ML1 and the second metal layer ML2 may be a light shield layer LS for shielding light.

A second active buffer layer ABUF2 may be disposed on the first metal layer ML1 and the second metal layer ML2. An active layer ACT of the driving transistor DRT may be disposed on the second active buffer layer ABUF2.

A gate insulation film GI may be disposed to cover the active layer ACT.

A gate electrode GATE of the driving transistor DRT may be disposed on the gate insulation film GI. In this case, in a position different from the position where the driving transistor DRT is formed, a gate material layer GM, together with the gate electrode GATE of the driving transistor DRT, may be disposed on the gate insulation film GI.

The first inter-layer insulation film ILD1 may be disposed to cover the gate electrode GATE and the gate material layer GM. A metal pattern TM may be disposed on the first inter-layer insulation film ILD1. The metal pattern TM may be located in a position different from the position where the driving transistor DRT is formed. The second inter-layer insulation film ILD2 may be disposed to cover the metal pattern TM on the first inter-layer insulation film ILD1.

Two first source-drain electrode patterns SD1 may be disposed on the second inter-layer insulation film ILD2. One of the two first source-drain electrode patterns SD1 is the source node of the driving transistor DRT, and the other is the drain node of the driving transistor DRT.

The two first source-drain electrode patterns SD1 may be electrically connected with the two opposite sides of the active layer ACT through the contact hole in the second inter-layer insulation film ILD2, the first inter-layer insulation film ILD1, and the gate insulation film GI.

Referring to FIG. 4, the second inter-layer insulation film ILD2 may include a 2-1th inter-layer insulation film ILD2-1 and a 2-2th inter-layer insulation film ILD2-2. The 2-1th inter-layer insulation film ILD2-1 may be positioned to cover the metal pattern TM. The 2-2th inter-layer insulation film ILD2-2 may be positioned on the 2-1th inter-layer insulation film ILD2-1.

A portion of the active layer ACT overlapping with the gate electrode GATE is a channel area. One of the two first source-drain electrode patterns SD1 may be connected to one side of the channel area in the active layer ACT, and the other one of the two first source-drain electrode patterns SD1 may be connected to the other side of the channel area in the active layer ACT.

A passivation layer PAS0 is disposed to cover the two first source-drain electrode patterns SD1. A planarization layer PLN may be disposed on the passivation layer PAS0. The planarization layer PLN may include a first planarization layer PLN1 and a second planarization layer PLN2. The first planarization layer PLN1 may be disposed on the passivation layer PAS0.

A second source-drain electrode pattern SD2 may be disposed on the first planarization layer PLN1. The second source-drain electrode pattern SD2 may be connected with one of the two first source-drain electrode patterns SD1 (corresponding to the second node N2 of the driving transistor DRT in the subpixel SP of FIG. 3) through the contact hole in the first planarization layer PLN1.

The second planarization layer PLN2 may be disposed to cover the second source-drain electrode pattern SD2. A light emitting element ED may be disposed on the second planarization layer PLN2.

In the stacked structure of the light emitting element ED, the anode electrode AE of the light emitting element ED may be disposed on the second planarization layer PLN2. The anode electrode AE may be electrically connected to the second source-drain electrode pattern SD2 through the contact hole in the second planarization layer PLN2.

The bank BANK may be disposed to cover a portion of the anode electrode AE. A portion of the bank BANK corresponding to the light emitting area EA of the subpixel SP may be opened.

A portion of the anode electrode AE may be exposed through an opening (open portion) of the bank BANK. A light emitting layer EL may be positioned on a side surface of the bank BANK and the opening (open portion) of the bank BANK. The whole or part of the light emitting layer EL may be positioned between adjacent banks BANK.

In the opening of the bank BANK, the light emitting layer EL may contact the anode electrode AE. A cathode electrode CE may be disposed on the light emitting layer EL.

The light emitting element ED may be formed by the anode electrode AE, the light emitting layer EL, and the cathode electrode CE. The light emitting layer EL may include an organic film.

An encapsulation layer ENCAP may be disposed on the above-described light emitting element ED.

The encapsulation layer ENCAP may have a single-layer structure or a multi-layer structure. For example, as illustrated in FIG. 4, the encapsulation layer ENCAP may include a first encapsulation layer PAS1, a second encapsulation layer PCL, and a third encapsulation layer PAS2.

For example, the first encapsulation layer PAS1 and the third encapsulation layer PAS2 may be inorganic films, and the second encapsulation layer PCL may be an organic layer. Among the first encapsulation layer PAS1, the second encapsulation layer PCL, and the third encapsulation layer PAS2, the second encapsulation layer PCL may be the thickest. Accordingly, the second encapsulation layer PCL may serve as a planarization layer. The first encapsulation layer PAS1 is also referred to as a first inorganic encapsulation layer. The second encapsulation layer PCL is also referred to as an organic encapsulation layer, and the third encapsulation layer PAS2 is also referred to as a second inorganic encapsulation layer.

The first encapsulation layer PAS1 may be disposed on the cathode electrode CE and be disposed closest to the light emitting element ED. The first encapsulation layer PAS1 may be formed of an inorganic insulating material capable of low-temperature deposition. For example, the first encapsulation layer PAS1 may be formed of silicon nitride (SiNx), silicon oxide (SiOx), silicon oxynitride (SiON), or aluminum oxide (Al2O3). Since the first encapsulation layer PAS1 is deposited in a low temperature atmosphere, the first encapsulation layer PAS1 may prevent damage to the light emitting layer EL including an organic material vulnerable to a high temperature atmosphere during the deposition process.

The second encapsulation layer PCL may have a smaller area than the first encapsulation layer PAS1. In this case, the second encapsulation layer PCL may be formed to expose two opposite ends of the first encapsulation layer PAS1. The second encapsulation layer PCL serves as a buffer for relieving stress between layers due to bending of the display device 100 and may also serve to enhance planarization performance. For example, the second encapsulation layer PCL may be an acrylic resin, an epoxy resin, polyimide, polyethylene, or silicon oxycarbonate (SiOC) and be formed of an organic insulating material. For example, the second encapsulation layer PCL may be formed through an inkjet scheme.

The third encapsulation layer PAS2 may be formed on the substrate SUB, where the second encapsulation layer PCL is formed, to cover the respective upper surfaces and side surfaces of the second encapsulation layer PCL and the first encapsulation layer PAS1. The third encapsulation layer PAS2 may minimize or block external moisture or oxygen from penetrating into the first encapsulation layer PAS1 and the second encapsulation layer PCL. For example, the third encapsulation layer PAS2 is formed of an inorganic insulating material, such as silicon nitride (SiNx), silicon oxide (SiOx), silicon oxynitride (SiON), or aluminum oxide (Al2O3).

Referring to FIG. 4, when the touch sensor TS is of a type embedded in the display panel 110, the touch sensor TS may be disposed on the encapsulation layer ENCAP. The touch sensor structure is described below in detail.

A touch buffer film T-BUF may be disposed on the encapsulation layer ENCAP. A touch sensor TS may be disposed on the touch buffer layer T-BUF.

The touch sensor TS may include touch sensor metals TSM and a bridge metal BRG positioned on different layers.

A touch inter-layer insulation film T-ILD may be disposed between the touch sensor metals TSM and the bridge metal BRG.

For example, the touch sensor metals TSM may include a first touch sensor metal TSM, a second touch sensor metal TSM, and a third touch sensor metal TSM that are disposed adjacent to each other. The third touch sensor metal TSM is disposed between the first touch sensor metal TSM and the second touch sensor metal TSM and, when the first touch sensor metal TSM and the second touch sensor metal TSM are electrically connected to each other, the first touch sensor metal TSM and the second touch sensor metal TSM may be electrically connected to each other through the bridge metal BRG positioned on a different layer. The bridge metal BRG may be insulated from the third touch sensor metal TSM by the touch inter-layer insulation film T-ILD.

When the touch sensor TS is formed on the display panel 110, moisture may be generated from the chemical solution (e.g., developer or etchant) used in the process. By disposing the touch sensor TS on the touch buffer layer T-BUF, it is possible to prevent a chemical solution or moisture from penetrating into the light emitting layer EL including an organic material during the manufacturing process of the touch sensor TS. Thus, the touch buffer film T-BUF may prevent damage to the light emitting layer EL vulnerable to chemicals or moisture.

The touch buffer film T-BUF is formed of an organic insulation material with a low permittivity of 1 to 3 and formed at a low temperature which is not more than a predetermined temperature (e.g., 100° C.) to prevent damage to the light emitting layer EL containing the organic material vulnerable to high temperature. For example, the touch buffer film T-BUF may be formed of an acrylic-based, epoxy-based, or siloxane-based material. As the display device 100 is bent, the encapsulation layer ENCAP may be damaged, and the touch sensor metal positioned on the touch buffer layer T-BUF may be broken. Even when the display device 100 is bent, the touch buffer layer T-BUF formed of an organic insulating material and having planarization capability may prevent damage to the encapsulation layer ENCAP and/or breakage of the metals TSM and BRG constituting the touch sensor TS.

A protection layer PAC may be disposed to cover the touch sensor TS. The protection layer PAC may be an organic insulation film.

Figure 5:
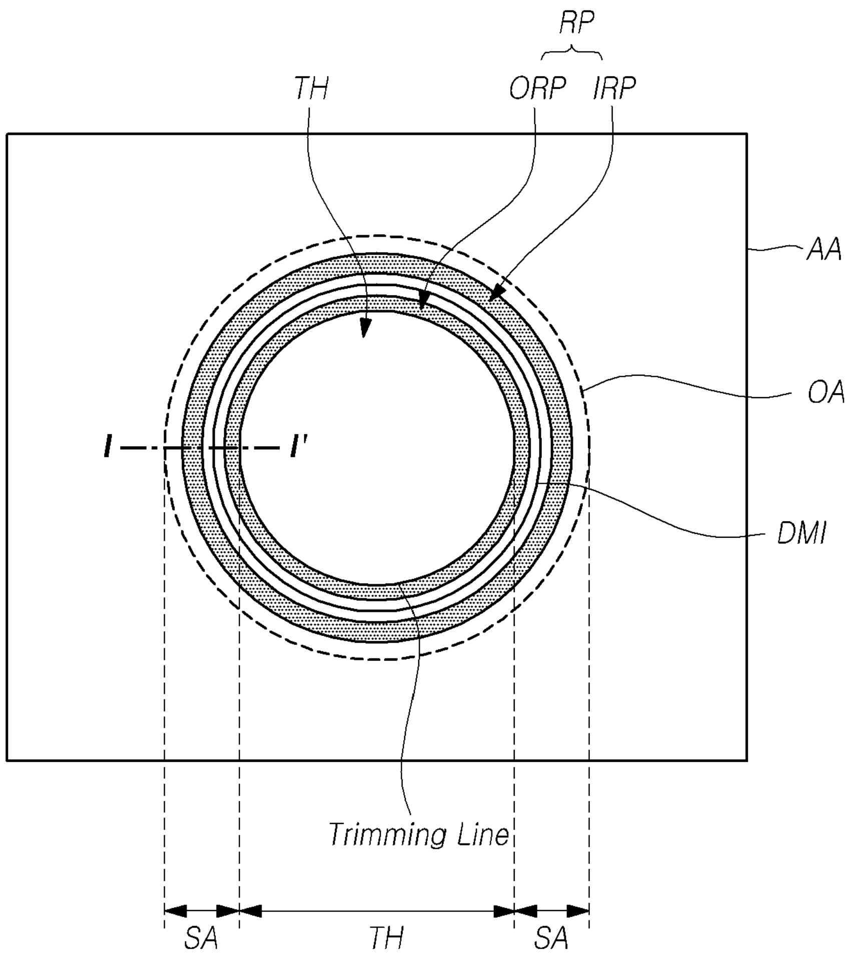
FIG. 5 is an enlarged plan view illustrating a structure of an optical area of a display panel according to aspects of the present disclosure.

FIG. 5 is an enlarged plan view illustrating a structure of an optical area OA of a display panel 110 according to aspects of the present disclosure.

Referring to FIG. 5, the optical area OA is disposed in the display area AA. Pixels (not shown) may be disposed around the optical area OA. The optical area OA may be either the first optical area OA1 or the second optical area OA2 described above.

Referring to FIG. 5, the optical area OA includes a through-hole TH and a surrounding area SA around the through-hole TH. A rough pattern may be positioned in the surrounding area SA. A subpixel for displaying an image may not be positioned in the optical area OA.

The through-hole TH may be formed by removing the substrate along a trimming line. The shape of the through-hole TH may be circular as shown in FIG. 5, but the through-hole TH may have various shapes, such as an oval, a square, a hexagon, or an octagon.

The rough pattern RP may include an inner side rough pattern IRP and an outer side rough pattern ORP.

Referring to FIG. 5, in the surrounding area SA, an inner dam DMI that separates the above-described two patterns IRP and ORP between the inner side rough pattern IRP and the outer side rough pattern ORP may be positioned.

An outer dam (not shown) disposed in the display area AA may be further positioned outside the inner side rough pattern IRP. The outer dam may be disposed to prevent the above-described second encapsulation layer PCL from overflowing the display area AA.

The shape of the inner dam DMI has a closed loop shape that corresponds to the shape of the through-hole TH and the inner dam DMI surrounds the through-hole TH. The inner dam DMI and the through-hole TH may have different closed loop shapes or may have the same closed loop shape but have different sizes. For example, the inner dam DMI and the through-hole TH may have a concentric shape and be spaced apart from each other by a predetermined interval.

The rough pattern RP has a closed loop shape corresponding to the shape of the through-hole TH and surrounds the through-hole TH. The rough pattern RP may have a closed loop shape different from that of the through-hole TH or may have a closed loop shape having the same shape but different sizes. As an example, as illustrated in FIG. 5, the rough pattern RP and the through-hole TH may have the same shape and be spaced apart from each other by a predetermined interval.

The subpixel disposed in the display area AA may include a light emitting element. When the light emitting element is an organic light emitting element, a light emitting layer (not shown) may be positioned in the display area AA, and the light emitting layer may be an organic light emitting layer including an organic material.

The organic light emitting layer may be disposed up to at least a partial area of the optical area OA.

Meanwhile, when moisture penetrates into the organic light emitting layer, a defect phenomenon, a defect, e.g., a dark spot, may occur in the subpixel. There is a possibility that moisture may penetrate in the area where the through-hole TH is positioned.

The above-described inorganic encapsulation layer (e.g., PAS1) may be positioned on the rough pattern RP. Moisture may penetrate through the inorganic encapsulation layer, and the rough pattern RP has the effect of lengthening the path through which moisture permeates in the inorganic encapsulation layer. The rough pattern RP may prevent moisture introduced from, e.g., the through-hole TH from reaching the light emitting layer positioned in the display area AA.

Figure 6:
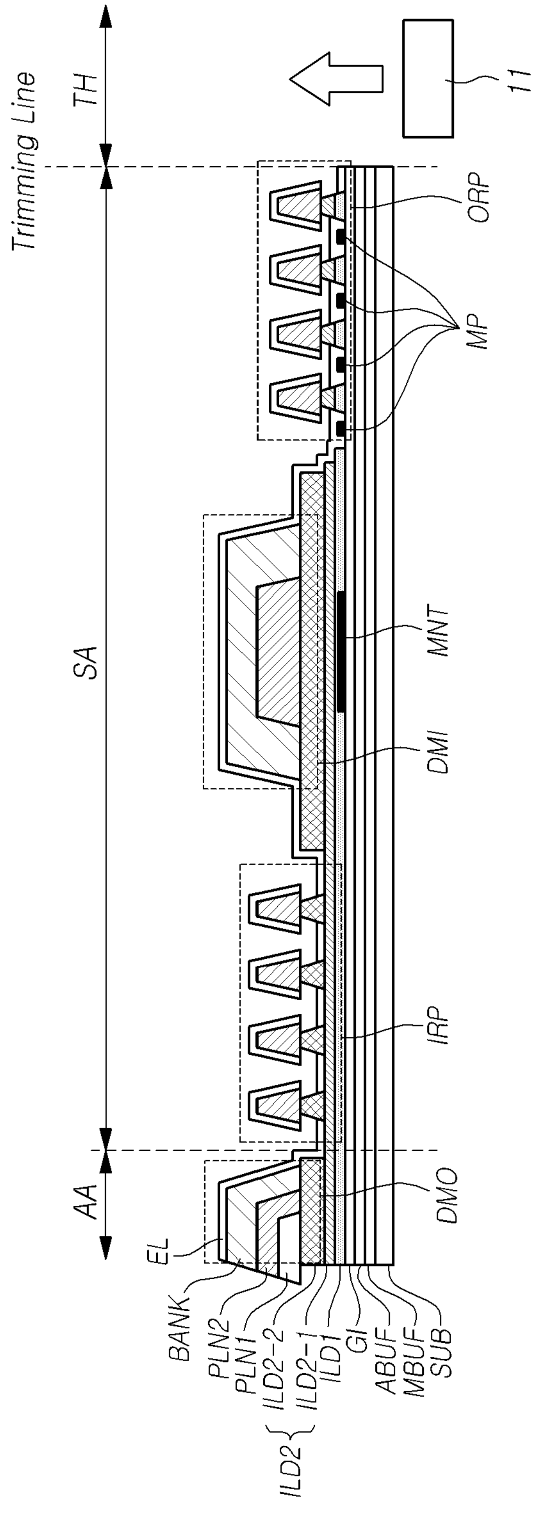
FIG. 6 is a cross-sectional view taken along I-I' of the optical area of FIG. 5.

FIG. 6 is a cross-sectional view taken along I-I' of the optical area OA of FIG. 5.

Referring to FIG. 6, the optical area OA may include the through-hole TH and the surrounding area SA, and the display area AA may be positioned outside the surrounding area SA.

An optical electronic device positioned under the display panel and at least partially overlapping with the through-hole TH may be positioned in the through-hole TH. This optical electronic device may be the above-described first optical electronic device 11.

Referring to FIG. 6, the display device according to aspects of the present disclosure may include a "dam structure", such as an outer dam DMO positioned in the display area AA and an inner dam DMI positioned in the surrounding area SA.

The dam structure may have a triple-layer structure formed perpendicular to the substrate SUB. For example, the dam structure may include a first layer formed of a planarization layer PLN, a second layer formed of a bank BANK, and a third layer formed of a spacer (not shown). Referring to FIG. 6, the above-described first planarization layer PLN1 and second planarization layer PLN2 are simply illustrated as a planarization layer PLN. In such a dam structure, at least a portion of the light emitting layer EL may be positioned on the spacer.

Some components constituting the light emitting element may be stacked on the inner dam DMI. For example, the light emitting layer EL and the common electrode (not shown) may be stacked in a shape extending over the internal dam DMI.

The rough pattern RP is positioned inside and outside the inner dam DMI. The rough pattern RP may include a mountain including an insulation layer (e.g., ILD1, ILD2-1, or ILD2-2) and a valley resultant from removing at least a portion of the insulation layer.

The light emitting layer EL may be positioned in at least a partial area of the rough pattern RP. The light emitting layer EL may be an organic light emitting layer including an organic material.

The light emitting layer EL may extend from the display area AA to at least a partial area of the surrounding area SA.

Referring to FIG. 6, the light emitting layer EL is discontinuously positioned in the inner side rough pattern IRP and the outer side rough pattern ORP. Thus, even when the moisture introduced from the through-hole TH permeates to the light emitting layer EL positioned in the surrounding area SA, the moisture does not penetrate to the light emitting layer EL positioned in the display area AA. In other words, as the light emitting layer EL is discontinuously present in the rough pattern RP, the permeation path of moisture may be lengthened, and the moisture introduced into the light emitting layer EL may be prevented from spreading to the display area AA.

Referring to FIG. 6, the height of the mountain may differ in the inner side rough pattern IRP and the outer side rough pattern ORP. The height of the mountain in the inner side rough pattern IRP may be larger than the height of the mountain in the outer side rough pattern ORP.

The difference in the height of the mountain between the inner side rough pattern IRP and the outer side rough pattern ORP may come from the difference in the inter-layer insulation film (e.g., ILD1, ILD2-1, or ILD2-2) included in the respective mountains of the inner side rough pattern IRP and the outer side rough pattern ORP.

For example, referring to FIG. 6, the mountain of the inner side rough pattern IRP may include the 2-2th inter-layer insulation film ILD2-2 but may not include the 2-1th inter-layer insulation film ILD2-1 and the first inter-layer insulation film ILD1. The mountain of the outer side rough pattern ORP may include the 2-1th inter-layer insulation film ILD2-1 and the first inter-layer insulation film ILD1 but may not include the 2-2th inter-layer insulation film ILD2-2.

Referring to FIG. 6, the bottom surface of the valley positioned in the outer side rough pattern ORP may be positioned lower than the bottom surface of the valley positioned in the inner side rough pattern IRP.

For example, in the outer side rough pattern ORP, the valley may be one formed as at least a portion (e.g., the 2-1th inter-layer insulation film ILD2-1) of the first inter-layer insulation film ILD1 and the second inter-layer insulation film ILD2 is removed.

Referring to FIG. 6, in the process of forming the valley of the rough pattern RP by removing the first inter-layer insulation film ILD1 from the outer side rough pattern ORP, the gate insulation film GI may be damaged, or the gate insulation film (e.g., ABUF or MBUF) positioned under the gate insulation film GI may be damaged.

Accordingly, the metal pattern MP is positioned in the valley positioned in the outer side rough pattern ORP.

Referring to FIG. 6, the metal pattern MP in the same shape as the valley positioned in the outer side rough pattern ORP may be disposed in the surrounding area SA. The metal pattern MP positioned corresponding to the valley of the rough pattern RP may function as an "etching stopper."

Alternatively, the metal pattern MP may be positioned to overlap with the mountain positioned on the outer side rough pattern ORP. In other words, the metal pattern MP may be widely positioned under the outer side rough pattern ORP. In this case, the metal pattern MP may also prevent the micro-cracks generated in the through-hole TH from spreading to the display area AA. In this case, the metal pattern MP may function not only as an etching stopper but also as a crack stopper.

The metal pattern MP may be positioned on the gate insulation film GI. The metal pattern MP may be formed of the same material as the gate electrode GATE of the driving transistor DRT of FIG. 3 described above.

The metal pattern MP is formed of a material different from the insulation film (e.g., the gate insulation film GI or the first inter-layer insulation film ILD1) above and below the metal pattern MP. Accordingly, even when the insulation film (e.g., the first inter-layer insulation film ILD1) covering the metal pattern MP is removed in a process, such as etching, the insulation film (e.g., the gate insulation film GI) under the metal pattern MP may be protected.

An align mark MNT may be positioned in the surrounding area SA. The align mark MNT is also called an "align key".

The align mark MNT may be disposed on the substrate SUB to form a through-hole TH by etching a preset area in the substrate SUB.

The align mark MNT may be disposed in a shape corresponding to the shape of the through-hole TH in the surrounding area SA or, in a shape different from that of the through-hole TH, may be disposed around the through-hole TH.

The align mark MNT may be positioned only in some areas of the top, bottom, left, and right of the through-hole TH.

The align mark MNT may be positioned on the same layer as the metal pattern MP.

For example, the align mark MNT may be formed of the same material as the gate electrode GATE. The align mark MNT may be positioned on the gate insulation film GI. The align mark MNT may be positioned to be covered by the first inter-layer insulation film ILD1.

The align mark MNT may be positioned in an area overlapping with the inner dam DMI. The align mark MNT may be positioned, e.g., between the inner side rough pattern IRP and the outer side rough pattern ORP.

Figure 7:
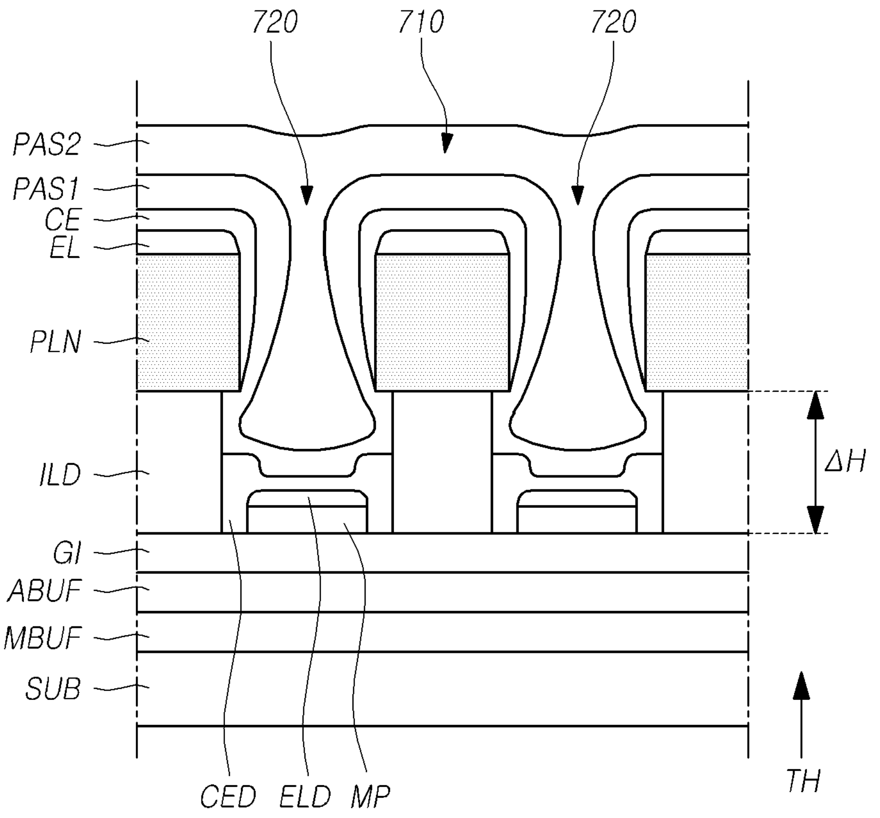
FIG. 7 is a cross-sectional view illustrating a rough pattern according to aspects of the present disclosure.

FIG. 7 is a cross-sectional view illustrating a rough pattern RP according to aspects of the present disclosure.

The above-described first inter-layer insulation film ILD1 and second inter-layer insulation film ILD2 are simply illustrated as the inter-layer insulation film ILD in FIG. 7. The above-described first planarization layer PLN1 and second planarization layer PLN2 are simply illustrated as the planarization layer PLN in FIG. 7.

Referring to FIG. 7, the rough pattern RP may include one or more mountains 710 and one or more valleys 720.

The mountain 710 includes an insulation film. The insulation film includes the inter-layer insulation film ILD and the planarization layer PLN. The valley 720 may be positioned between two different mountains 710. The valley 720 may be formed by removing the insulation film.

Referring to FIG. 7, the rough pattern RP may be formed by stacking multi-buffer layers MBUF, active buffer layers ABUF, and gate insulation film GI on the substrate SUB and then removing the inter-layer insulation film ILD to a certain depth.

Referring to FIG. 7, the valley 720 may have a well or trench shape resultant from removing the inter-layer insulation film ILD to a certain depth.

Referring to FIG. 7, the same material as the light emitting layer EL of the light emitting element and the same material as the cathode electrode CE may be positioned in the mountain 710 positioned in the rough pattern RP. Hereinafter, for convenience, the same material as the light emitting layer EL positioned on the mountain 710 is referred to as the light emitting layer EL, and the same material as the cathode electrode CE positioned on the mountain 710 is referred to as the cathode electrode CE.

Referring to FIG. 7, the light emitting layer EL is positioned on the upper surface of the mountain 710. The light emitting layer EL may be positioned in at least a partial area of the side surface of the mountain 710.

In the valley 720 positioned in the rough pattern RP, a residual light emitting layer ELD having the same material as the light emitting layer EL and a residual cathode electrode CED having the same material as the cathode electrode CE are positioned.

The residual light emitting layer ELD positioned in the valley 720 may be disconnected from the light emitting layer EL positioned in the mountain 710. The residual cathode electrode CED positioned in the valley 720 may be disconnected from the cathode electrode CE positioned in the mountain 710.

Accordingly, moisture penetrating from the through-hole TH to the light emitting layer EL or the residual light emitting layer ELD may be prevented from penetrating to the display area AA.

Referring to FIG. 7, the first inorganic encapsulation layer PAS1 and the second inorganic encapsulation layer PAS2 may be stacked on the cathode electrode CE and the residual cathode electrode CED.

The first inorganic encapsulation layer PAS1 may extend over the cathode electrode CE in the mountain 710 to the valley 720. The first inorganic encapsulation layer PAS1 may fill the area where the light emitting layer EL and the residual light emitting layer ELD are disconnected from each other.

The second inorganic encapsulation layer PAS2 may be positioned on the first inorganic encapsulation layer PAS1. The second inorganic encapsulation layer PAS2 may fill the area in the valley 720, where is not filled by the first inorganic encapsulation layer PAS1. In the area where the light emitting layer EL and the residual light emitting layer ELD are disconnected, one or more of the residual cathode electrode CED, the first inorganic encapsulation layer PAS1, and the second inorganic encapsulation layer PAS2 may be positioned.

Referring to FIG. 7, the metal pattern MP may be further positioned on the bottom surface of the valley 720. The metal pattern MP may be disposed to prevent the buffer layers (e.g., ABUF and MBUF) on the substrate SUB from being etched.

When the buffer layers (e.g., ABUF and MBUF) on the substrate SUB are damaged, micro-cracks may occur in the damaged area and spread to other areas of the display panel. In this case, moisture penetrating from the lower portion of the substrate SUB may easily permeate to the upper portion, degrading display quality.

Accordingly, the metal pattern MP may be positioned on the buffer layer (e.g., ABUF or MBUF) and, in some cases, the metal pattern MP may be disposed on the gate insulation film GI positioned on the buffer layer. FIG. 7 illustrates that the metal pattern MP is disposed on the gate insulation film GI, but the metal pattern MP may be disposed between the buffer layer and the gate insulation film GI or disposed on another inter-layer insulation film ILD.

Referring to FIG. 7, the metal pattern MP may be positioned on the bottom surface of the valley 720, and the residual light emitting layer ELD may be positioned on the metal pattern MP. At least a portion of the residual light emitting layer ELD may be positioned on a side surface of the metal pattern MP.

As described above, in the inner side rough pattern IRP and the outer side rough pattern ORP, the thickness ΔH of the inter-layer insulation film ILD of the mountain 710 may differ. As the valley 720 is formed in the area where the inter-layer insulation film ILD has been removed, the depth ΔH of the valley 720 may be said to correspond to the thickness ΔH of the inter-layer insulation film ILD.

If the thickness ΔH of the inter-layer insulation film ILD is relatively large or if the depth of the valley 720 is relatively large, it becomes the height of the mountain 710. Accordingly, an area where a portion of the first inorganic encapsulation layer PAS1 does not exist may be formed near the bottom surface of the valley 720.

The first inorganic encapsulation layer PAS1 may include a seam (also referred to as a void) where the first inorganic encapsulation layer PAS1 does not exist near the bottom surface of the valley 720. According to the thickness ΔH of the inter-layer insulation film ILD, the placement of the seam is slightly different.

For example, if the thickness ΔH of the inter-layer insulation film ILD is relatively large, the height of the mountain 710 is high, so that a seam where an opening is positioned to the surface of the first inorganic encapsulation layer PAS1 is formed. On the contrary, when the thickness ΔH of the inter-layer insulation film ILD is relatively small, the height of the mountain 710 is low, so that a seam where no opening is formed to the surface of the first inorganic encapsulation layer PAS1 is formed.

In terms of lengthening the moisture permeation path, it is advantageous to form a seam having an opening in the surface of the inorganic encapsulation layer PAS1. However, in the case of the outer side rough pattern ORP positioned adjacent to the through-hole TH, moisture may directly permeate through the seam, and in this case, such an effect as if the moisture permeation path is rather shortened may occur, so that a chance of damage to the light emitting layer EL positioned in the display area AA may increase.

Accordingly, in the display device 100 according to aspects of the present disclosure, the height of the mountain 710 differs between the outer side rough pattern ORP and the inner side rough pattern IRP. The mountains 710 positioned in the outer side rough pattern ORP and the inner side rough pattern IRP may include inter-layer insulation films ILD having different heights.

Referring to FIGS. 6 and 7, the mountain 710 positioned in the outer side rough pattern ORP may include at least one inter-layer insulation film ILD which is not included in the mountain 710 positioned in the inner side rough pattern IRP. Such an inter-layer insulation film ILD may be an inter-layer insulation film positioned in a lower layer than the inter-layer insulation film ILD included in the mountain 710 positioned in the inner side rough pattern IRP.

For example, referring to FIGS. 6 and 7, the mountain 710 positioned in the inner inter-layer insulation film ILD may include the 2-2th inter-layer insulation film ILD2-2. The mountain 710 positioned in the outer inter-layer insulation film ILD may include the first inter-layer insulation film ILD1 and the 2-1th inter-layer insulation film ILD2-1. In other words, the mountain 710 positioned in the outer inter-layer insulation film ILD may include an inter-layer insulation film (e.g., ILD1 or ILD2-1) that is not included in the mountain 710 positioned in the inner inter-layer insulation film ILD.

Referring to FIGS. 6 and 7, the thickness of the inter-layer insulation film (e.g., ILD2-2) included in the mountain 710 positioned in the inner side rough pattern IRP may be larger than the thickness of the inter-layer insulation film (e.g., ILD2-1 or ILD1) included in the mountain 710 positioned in the outer side rough pattern ORP. Accordingly, as the opening is positioned in the surface of the first inorganic encapsulation layer PAS1 positioned on the inner side rough pattern IRP, the moisture permeation path may be lengthened. In the first inorganic encapsulation layer PAS1 positioned on the outer side rough pattern ORP, the opening is not positioned in the surface, so that moisture is prevented from directly penetrating into the first inorganic encapsulation layer PAS1 from the through-hole TH.

Figure 8:
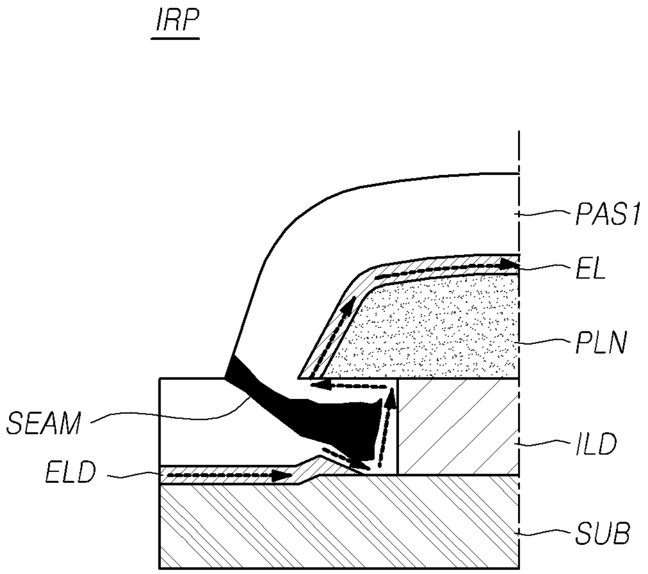
FIG. 8 is a view illustrating a moisture permeation path in an inner side rough pattern.

FIG. 8 is a view illustrating a moisture permeation path in an inner side rough pattern IRP.

FIG. 8 is a view for briefly describing a moisture vapor transmission path and illustrates the above-described substrate SUB, multi-buffer layer MBUF, active buffer layer ABUF, and gate insulation film GI, simply as a substrate SUB. The residual cathode electrode ECD may be further disposed on the residual light emitting layer ELD. The following description focuses primarily on a path through which moisture introduced into the residual light emitting layer ELD penetrates into the light emitting layer EL.

Referring to FIG. 8, the moisture that has penetrated into the residual light emitting layer ELD may move to one side. The movement direction of moisture may be, e.g., a direction from the above-described through-hole TH to the display area AA.

Moisture penetrating into the residual light emitting layer ELD moves from an end of the residual light emitting layer ELD to the light emitting layer EL. In this case, moisture may move along the inside of the first inorganic encapsulation layer PAS1. In other words, the moisture may move in the order of the residual light emitting layer ELD, the first inorganic encapsulation layer PAS1, and the light emitting layer EL.

The first inorganic encapsulation layer PAS1 includes a seam SEAM. The seam SEAM may be empty or may be filled with a material different from the first inorganic encapsulation layer PAS1.

The moisture that has moved from the residual light emitting layer ELD to the first inorganic encapsulation layer PAS1 may not pass through the SEAM but goes around the SEAM to the light emitting layer EL.

In the inner side rough pattern IRP, the seam SEAM includes an opening positioned toward the surface of the first inorganic encapsulation layer PAS1.

Accordingly, moisture does not move in a direction close to the surface of the inorganic encapsulation layer PAS1 but moves around the seam SEAM inside of the inorganic encapsulation layer PAS1 to the light emitting layer EL. Accordingly, the movement path of moisture in the inorganic encapsulation layer PAS1 may be further lengthened.

In the case of the inner side rough pattern (IRP), it is positioned relatively far from the above-described through-hole TH, so that the moisture introduced from the through-hole TH rarely flows directly to the seam SEAM. Accordingly, it is possible to form the seam SEAM so that the opening of the seam SEAM is positioned toward the surface of the first inorganic encapsulation layer PAS1.

Figure 9:
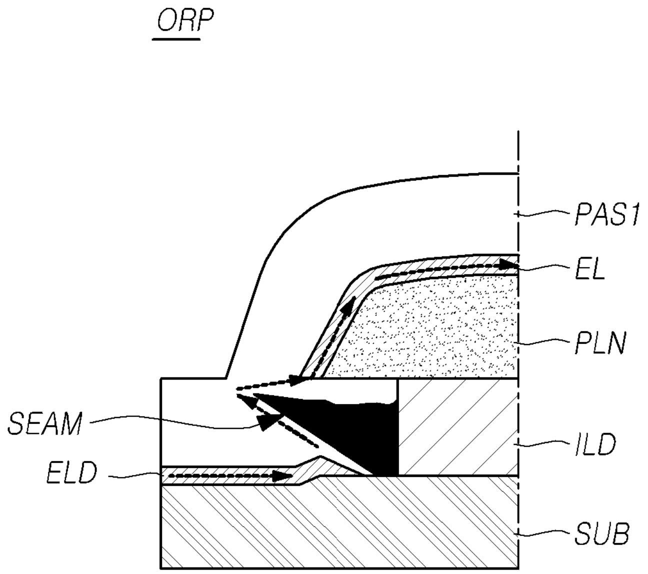
FIG. 9 is a view illustrating a moisture permeation path in an outer side rough pattern.

FIG. 9 is a view illustrating a moisture permeation path in an outer side rough pattern ORP.

Referring to FIG. 9, the moisture introduced into the residual light emitting layer ELD may enter the light emitting layer EL through the first inorganic encapsulation layer PAS1. The penetration direction of moisture may be, e.g., a direction from the above-described through-hole TH to the display area AA.

The moisture escaping from the residual light emitting layer ELD may penetrate into the light emitting layer EL through the first inorganic encapsulation layer PAS1. In this case, the movement path of moisture in the first inorganic encapsulation layer PAS1 may be around the seam SEAM formed in the outer side rough pattern ORP.

Referring to FIG. 9, the seam SEAM formed in the outer side rough pattern ORP may not include the opening positioned toward the surface of the first inorganic encapsulation layer PAS1, unlike the seam SEAM formed in the above-described inner side rough pattern IRP. The moisture movement path shown in FIG. 9 may be relatively short as compared to the moisture movement path shown in FIG. 8.

However, if the seam formed in the outer side rough pattern ORP includes an opening positioned in the surface of the first inorganic encapsulation layer PAS1, moisture may directly penetrate through the opening. In this case, the length of the path through which moisture moves in the first inorganic encapsulation layer PAS1 may be significantly shorter than the length of the path illustrated in FIGS. 8 and 9. Accordingly, the possibility of moisture reaching the light emitting layer EL positioned in the display area AA increases. In other words, the degradation of display quality may be highly likely.

Accordingly, in the display device 100 according to aspects of the present disclosure, the first inorganic encapsulation layer PAS1 of the outer side rough pattern ORP includes the seam SEAM. In the seam SEAM, the opening is not positioned in the surface of the first inorganic encapsulation layer PAS1.

Accordingly, in the display device 100 according to aspects of the present disclosure, the seam SEAM to guide the moisture movement path in the outer side rough pattern ORP and the inner side rough pattern IRP may be said to be positioned in different patterns.

Referring to FIGS. 7 to 9, the inter-layer insulation film ILD in the inner side rough pattern IRP may be removed to a first depth ΔH1, and the inter-layer insulation film ILD in the outer side rough pattern ORP may be removed to a second depth ΔH2. The first depth ΔH1 may be larger than the second depth ΔH2. In other words, the depth of the valley 720 in the inner side rough pattern IRP may be the first depth ΔH1, and the depth of the valley 720 in the outer side rough pattern ORP may be the second depth ΔH2 smaller than the first depth ΔH1.

Referring to FIG. 6, the thickness of the 2-2th inter-layer insulation film ILD2-2 in the inner side rough pattern IRP may be larger than the sum of the thicknesses of the 2-1th inter-layer insulation film ILD2-1 and the first inter-layer insulation film ILD1 in the outer side rough pattern ORP.

In the display device 100 according to aspects of the present disclosure, to dispose the seams SEAM in different patterns in the outer side rough pattern ORP and the inner side rough pattern IRP, the thickness of the inter-layer insulation film ILD may differ in the outer side rough pattern ORP and the inner side rough pattern IRP.

In the display device 100 according to aspects of the present disclosure, e.g., the inner side rough pattern IRP, may include the 2-2th inter-layer insulation film ILD2-2, and the outer side rough pattern ORP may include the 2-1th inter-layer insulation film ILD2-1 and the first inter-layer insulation film ILD1.

In the display device 100 according to aspects of the present disclosure, the metal pattern MP may be disposed on the buffer layers to prevent damage to the substrate SUB and various buffer layers (e.g., MBUF and ABUF) disposed under the inter-layer insulation film ILD during the process of forming the outer side rough pattern ORP.

In the display device 100 according to aspects of the present disclosure, the metal pattern MP may be disposed in the valley 720 of the rough pattern RP.

In the display device 100 according to aspects of the present disclosure, the metal pattern MP may be positioned in the valley 720 of the outer side rough pattern ORP. The metal pattern MP may be positioned on the bottom surface of the valley 720 of the rough pattern RP.

In the display device 100 according to aspects of the present disclosure, the metal pattern MP may be positioned to overlap with the mountain 710 positioned in the rough pattern RP.

In the display device 100 according to aspects of the present disclosure, the light emitting layer EL may be positioned on the metal pattern MP.

In the display device 100 according to aspects of the present disclosure, the seam SEAM to guide the moisture movement path in the outer side rough pattern ORP and the inner side rough pattern IRP may be positioned in different patterns.

Figure 10:
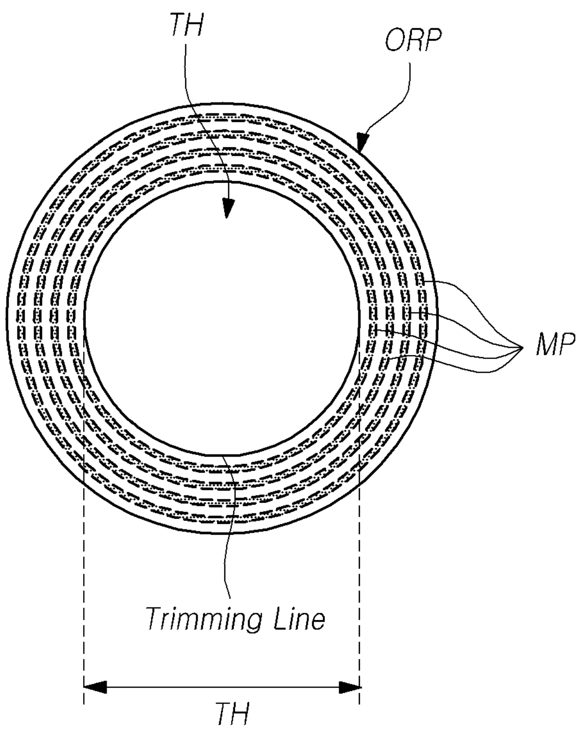
FIG. 10 is a view schematically illustrating an example in which two or more metal patterns are positioned to overlap with an outer side rough pattern in a display device according to aspects of the present disclosure.

FIG. 10 is a view schematically illustrating an example in which two or more metal patterns MP are positioned to overlap with an outer side rough pattern ORP in a display device 100 according to aspects of the present disclosure.

Referring to FIG. 10, two or more metal patterns MP may be positioned to overlap with the outer side rough pattern ORP. The metal patterns MP may be disposed in positions corresponding to the valleys 720 positioned in the outer side rough pattern ORP.

The metal patterns MP may be disposed, around the through-hole TH, in a shape corresponding to the shape of the through-hole TH. For example, referring to FIG. 10, the metal patterns MP may be disposed in the form of concentric circles outside the through-hole TH.

Accordingly, in the process of forming the valley 720 positioned in the outer side rough pattern ORP, the metal pattern MP may function as an etching stopper to prevent damage to the buffer layers (e.g., ABUF and MBUF).

Figure 11:
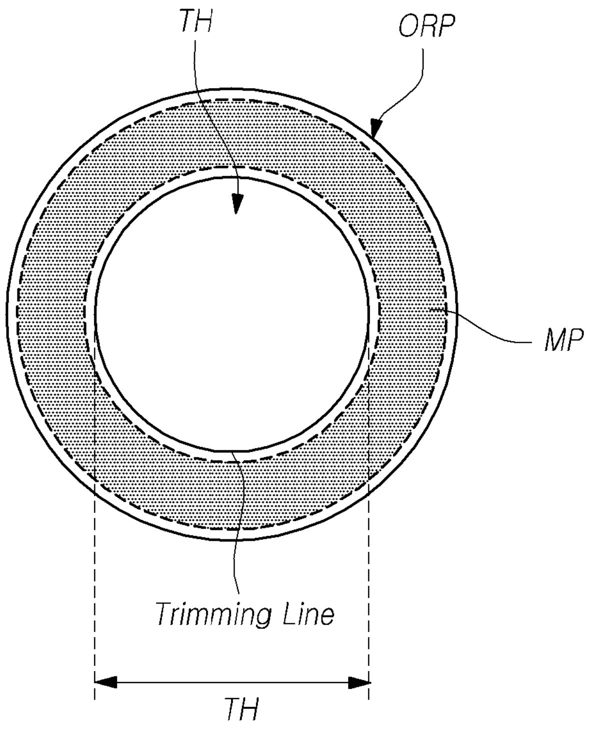
FIG. 11 is a view schematically illustrating an example in which one metal pattern is positioned to overlap with an outer side rough pattern in a display device according to aspects of the present disclosure.

FIG. 11 is a view schematically illustrating an example in which one metal pattern MP is positioned to overlap with an outer side rough pattern ORP in a display device 100 according to aspects of the present disclosure.

Referring to FIG. 11, the metal pattern MP may be disposed to overlap with, in a wide range, the outer side rough pattern ORP. Specifically, the metal pattern MP may be disposed to overlap with the mountain 710 and the valley 720 positioned in the outer side rough pattern ORP.

Accordingly, the metal pattern MP may function as the above-described etching stopper. The metal pattern MP may be positioned to overlap with, in a wide range, the outer side rough pattern ORP and function as a "crack stopper" capable of preventing micro-cracks caused in the through-hole TH from spreading through the outer side rough pattern ORP to the display area AA.

The foregoing aspects of the present disclosure are briefly described below.

Aspects of the present disclosure may provide a display device 100 comprising a display panel 110 having a through-hole TH and a rough pattern RP around the through-hole TH, an optical electronic device (e.g., 11 or 12) positioned to at least partially overlap with the through-hole TH, and a metal pattern MP positioned in a valley 720 of the rough pattern RP.

Aspects of the present disclosure may provide the display device 100, wherein the display panel 110 includes a display area AA where a subpixel SP including a light emitting element is positioned, and a light emitting layer EL commonly positioned in at least a partial area of the display area AA, wherein the light emitting layer EL is disconnected in the rough pattern RP, and wherein the light emitting layer EL is positioned in at least a partial area on the metal pattern MP.

Aspects of the present disclosure may provide the display device 100, wherein the display panel 110 includes an optical area (e.g., OA1 or OA2) where the through-hole TH and the rough pattern RP are positioned, and a display area AA where a subpixel SP is positioned outside the optical area (e.g., OA1 or OA2), wherein the rough pattern RP includes an outer side rough pattern ORP positioned in an area adjacent to the through-hole TH, and an inner side rough pattern IRP positioned in an area adjacent to the display area AA and different in valley 720 depth from the outer side rough pattern ORP.

Aspects of the present disclosure may provide the display device 100, wherein the display panel 110 includes a substrate SUB, and an inter-layer insulation film (e.g., ILD1, ILD2-1, or ILD2-2) positioned on the substrate SUB to cover at least one electrode, and wherein the rough pattern RP includes a valley 720 positioned in an area where at least a portion of the inter-layer insulation film (e.g., ILD1, ILD2-1, or ILD2-2) has been removed.

Aspects of the present disclosure may provide the display device 100, wherein the valley 720 positioned in the outer side rough pattern ORP has a first depth ΔH1, and the valley 720 positioned in the inner side rough pattern IRP has a second depth ΔH2 larger than the first depth ΔH1.

Aspects of the present disclosure may provide the display device 100, wherein the metal pattern MP is positioned on a lower layer than a bottom surface of the valley 720 positioned in the inner side rough pattern IRP.

Aspects of the present disclosure may provide the display device 100, wherein the subpixel SP further includes a driving transistor DRT configured to drive the light emitting element, wherein the driving transistor DRT includes an active layer ACT including a channel area and a gate electrode GATE positioned to overlap with the channel area, and wherein the metal pattern MP is positioned on a same layer as the gate electrode GATE.

Aspects of the present disclosure may provide the display device 100, wherein the display panel 110 further includes an inorganic encapsulation layer PAS1 positioned to overlap with the rough pattern RP, and wherein the inorganic encapsulation layer PAS1 includes a seam SEAM for guiding a moisture permeation path.

Aspects of the present disclosure may provide the display device 100, wherein the seam SEAM has an opening positioned in a surface of the inorganic encapsulation layer PAS1 positioned in the inner side rough pattern IRP.

Aspects of the present disclosure may provide the display device 100, wherein the seam SEAM has no opening positioned in a surface of the inorganic encapsulation layer PAS1 positioned in the outer side rough pattern ORP.

Aspects of the present disclosure may provide the display device 100, wherein the metal pattern MP is positioned to surround the through-hole TH.

Aspects of the present disclosure may provide the display device 100, wherein the rough pattern RP includes a mountain 710 positioned between two different valleys 720, and wherein the metal pattern MP is positioned to overlap with the mountain 710.

Aspects of the present disclosure may provide the display device 100, wherein the display panel 110 further includes an align mark MNT positioned between the through-hole TH and the display area AA, and wherein the metal pattern MP and the align mark MNT are positioned on a same layer.

Aspects of the present disclosure may provide a display device 100 comprising a display panel 110 including a through-hole TH, an optical area (e.g., OA1 or OA2) having a rough pattern RP including a mountain 710 and a valley 720 around the through-hole TH, and a display area AA where a subpixel SP is positioned outside the optical area (e.g., OA1 or OA2), and an optical electronic device (e.g., 11 or 12) positioned to at least partially overlap with the through-hole TH, wherein the rough pattern RP includes an outer side rough pattern ORP positioned adjacent to the through-hole TH, and an inner side rough pattern IRP positioned adjacent to the display area AA, outside the outer side rough pattern ORP, and wherein the valley 720 in the inner side rough pattern IRP is deeper than the valley 720 in the outer side rough pattern ORP.

Aspects of the present disclosure may provide the display device 100, wherein a metal pattern MP is positioned on a bottom surface of the valley 720 positioned in the outer side rough pattern ORP.

Aspects of the present disclosure may provide the display device 100, wherein the metal pattern MP is positioned to overlap with the mountain 710 of the outer side rough pattern ORP.

Aspects of the present disclosure may provide the display device 100, wherein the subpixel SP includes a light emitting element ED and a driving transistor DRT configured to drive the light emitting element ED, wherein the driving transistor DRT includes an active layer ACT where a channel area is positioned and a gate electrode GATE positioned to overlap with the active layer ACT, and wherein the metal pattern MP is positioned on a same layer as the gate electrode GATE.

Aspects of the present disclosure may provide the display device 100, wherein the display panel 110 includes a substrate SUB and two or more inter-layer insulation films (e.g., ILD1 or ILD2) positioned on the substrate SUB to cover different electrodes (e.g., ACT, SD1, GATE, TM, GM, ML1, and ML2), and wherein at least one (e.g., the second inter-layer insulation film ILD2-2) of the two or more inter-layer insulation films is included in the mountain 710 positioned in the inner side rough pattern IRP but is not included in the mountain 710 positioned in the outer side rough pattern ORP.

Aspects of the present disclosure may provide a display device 100 comprising a substrate, a through-hole of the substrate, a rough pattern around the through-hole, and a metal pattern positioned in a valley of the rough pattern.

The above description has been presented to enable any person skilled in the art to make and use the technical idea of the present disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to the aspects shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display device, comprising:

a display panel including an optical area where a through-hole and a rough pattern around the through-hole are positioned and a display area where a subpixel is positioned outside the optical area;

an optical electronic device positioned to at least partially overlap with the through-hole; and a metal pattern positioned in a valley of the rough pattern, and an align mark positioned between the through-hole and the display area, and wherein the metal pattern and the align mark are positioned on a same layer.

2. The display device of claim 1, wherein the display panel includes:

the display area including a light emitting element is positioned; and a light emitting layer commonly positioned in at least a partial area of the display area, wherein the light emitting layer is disconnected in the rough pattern, and positioned in at least a partial area on the metal pattern.

3. The display device of claim 1, wherein the display area is positioned outside the optical area, wherein the rough pattern includes:

an outer side rough pattern positioned in an area adjacent to the through-hole; and an inner side rough pattern positioned in an area adjacent to the display area and different in valley depth from the outer side rough pattern.

4. The display device of claim 3, wherein the display panel includes:

a substrate; and an inter-layer insulation film positioned on the substrate to cover at least one electrode, wherein the rough pattern includes a valley positioned in an area where at least a portion of the inter-layer insulation film is removed.

5. The display device of claim 4, wherein the valley positioned in the outer side rough pattern has a first depth, and the valley positioned in the inner side rough pattern has a second depth larger than the first depth.

6. The display device of claim 4, wherein the metal pattern is positioned on a lower layer than a bottom surface of the valley positioned in the inner side rough pattern.

7. The display device of claim 2, wherein the subpixel further includes a driving transistor configured to drive the light emitting element, wherein the driving transistor includes an active layer including a channel area and a gate electrode positioned to overlap with the channel area, and wherein the metal pattern is positioned on a same layer as the gate electrode.

8. The display device of claim 3, wherein the number of valleys positioned in the outer side rough pattern is identical to the number of metal patterns surrounding the through-hole.

9. The display device of claim 3, wherein the display panel further includes an inorganic encapsulation layer positioned to overlap with the rough pattern, and wherein the inorganic encapsulation layer includes a seam for guiding a moisture permeation path.

10. The display device of claim 9, wherein the seam differs in shape depending on a depth of the valley.

11. The display device of claim 9, wherein the seam has an opening positioned in a surface of the inorganic encapsulation layer positioned in the inner side rough pattern.

12. The display device of claim 9, wherein the seam has no opening positioned in a surface of the inorganic encapsulation layer positioned in the outer side rough pattern.

13. The display device of claim 1, wherein the metal pattern is positioned to surround the through-hole.

14. The display device of claim 1, wherein the rough pattern includes a mountain positioned between two different valleys, and wherein the metal pattern is positioned to overlap with the mountain.

15. A display device, comprising:

a display panel including a through-hole, an optical area having a rough pattern including a mountain and a valley around the through-hole, and a display area where a subpixel is positioned outside the optical area; and an optical electronic device positioned to at least partially overlap with the through-hole, wherein the rough pattern includes:

an outer side rough pattern positioned adjacent to the through-hole;

an inner side rough pattern positioned adjacent to the display area, outside the outer side rough pattern, and an align mark positioned between the through-hole and the display area, wherein a metal pattern and the align mark are positioned on a same layer, wherein the valley in the inner side rough pattern is deeper than the valley in the outer side rough pattern, wherein at least one inter-layer insulation film included in the mountain positioned in the inner side rough pattern is not included in the mountain positioned in the outer side rough pattern, and wherein the metal pattern is positioned on a bottom surface of the valley positioned in the outer side rough pattern.

16. The display device of claim 15, wherein the metal pattern is positioned to overlap with the mountain of the outer side rough pattern.

17. The display device of claim 15, wherein the subpixel includes a light emitting element and a driving transistor configured to drive the light emitting element, wherein the driving transistor includes an active layer where a channel area is positioned and a gate electrode positioned to overlap with the active layer, and wherein the metal pattern is positioned on a same layer as the gate electrode.

18. The display device of claim 15, wherein the display panel includes a substrate and two or more inter-layer insulation films positioned on the substrate to cover different electrodes, and wherein the at least one inter-layer insulation film is at least one of the two or more inter-layer insulation films included in the mountain positioned in the inner side rough pattern but not included in the mountain positioned in the outer side rough pattern.

19. A display device, comprising:

a substrate including an optical area, and a display area outside the optical area;

a through-hole of the substrate in the optical area;

a rough pattern around the through-hole in the optical area;

a metal pattern positioned in a valley of the rough pattern, and an align mark positioned between the through-hole and the display area, and wherein the metal pattern and the align mark are positioned on a same layer.

* * * * *